United States Patent
Ida

(10) Patent No.: US 6,835,670 B2
(45) Date of Patent: Dec. 28, 2004

(54) METHOD OF MANUFACTURING SEMICONDUCTOR DEVICE

(75) Inventor: Koji Ida, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/612,068

(22) Filed: Jul. 3, 2003

(65) Prior Publication Data

US 2004/0152335 A1 Aug. 5, 2004

(30) Foreign Application Priority Data

Jan. 30, 2003 (JP) .......................................... 2003-022062

(51) Int. Cl.$^7$ .............................................. H01L 21/31
(52) U.S. Cl. ......................... 438/761; 438/585; 438/586; 438/587; 438/595; 438/763; 438/780
(58) Field of Search ................................. 438/585, 586, 438/587, 595, 761, 763, 780, 197

(56) References Cited

U.S. PATENT DOCUMENTS 6,417,083 B1 * 7/2002 Mori ........................... 438/585

FOREIGN PATENT DOCUMENTS

| JP | 59-182537 | 10/1984 |
| JP | 2001-93970 | 4/2001 |

* cited by examiner

Primary Examiner—Renee R. Berry
(74) Attorney, Agent, or Firm—McDermott Will & Emery LLP

(57) ABSTRACT

A silicon nitride film and a silicon oxynitride film as an antireflection coating are successively formed on a silicon substrate. The silicon nitride film and the silicon oxynitride film are patterned. A reduction treatment for reducing the amount of oxygen atoms is performed on the silicon oxynitride film. The silicon oxynitride film after the reduction treatment and the silicon nitride film are used as a mask to etch the silicon substrate, thereby forming a trench in a main surface of the silicon substrate. This trench is filled with an insulating film.

6 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a trench element-isolation structure in a semiconductor device.

2. Description of the Background Art

A trench element-isolation structure is known as an exemplary element-isolation structure in a semiconductor device. Japanese Patent Laying-Open Nos. 2001-93970 and 59-182537 disclose a method of manufacturing a semiconductor device having a trench element-isolation structure.

Japanese Patent Laying-Open No. 2001-93970 describes a method of forming a trench element-isolation structure as follows. An underlying silicon oxide film, a silicon nitride film, and an antireflection coating are formed on a semiconductor substrate, and these films are patterned using a resist as a mask. Thereafter, the resist and the antireflection coating are removed, and a trench is formed in the semiconductor substrate using the silicon nitride film and the silicon oxide film as a mask. The trench is filled with a silicon oxide film.

Japanese Patent Laying-Open No. 59-182537 describes a method of forming a trench element-isolation structure as follows. An oxide film, a silicon nitride film, and a silicon oxide film are formed on a silicon substrate, and these films are patterned into a prescribed shape. The patterned oxide film, silicon nitride film and silicon oxide film are used as a mask to etch the silicon substrate to form a trench. The trench is filled with boro-silicate glass (BSG).

In the method of manufacturing a semiconductor device described in Japanese Patent Laying-Open Nos. 2001-93970 and 59-182537 as described above, a trench is formed by etching using a silicon nitride film and a silicon oxide film as a mask. A trench may be formed by etching with an antireflection coating left on a silicon nitride film ($Si_3N_4$ film).

When etching for forming a trench is performed with an antireflection coating left on a silicon nitride film, the antireflection coating usually disappears in the etching. Depending on a material of the antireflection coating, however, an etching rate (a sputtering etching rate) in a facet portion is greater than an etching rate (a reactive ion etching rate) in a flat portion in the antireflection coating. As a result, an upper end corner portion of the antireflection coating is rounded off and an upper end corner portion of the silicon nitride film is also rounded off, accordingly.

In the etching described above, an etching gas (etchant) also collides with this rounded, upper end corner portion. After colliding with the upper end corner portion of the rounded silicon nitride film, a part of etching gas has its direction of travel changed toward a trench sidewall and collides with the trench sidewall. Therefore, the amount of the etching gas that collides with the trench sidewall is increased, and the trench sidewall is unnecessarily recessed. As a result, the trench sidewall assumes a concave shape or a bowing shape in the central portion or in the vicinity of the bottom portion in its height direction. If a trench having such a shape is filled with an insulating film, a space portion is easily formed in the insulating film, which may cause the trench to be poorly filled.

SUMMARY OF THE INVENTION

The present invention is made to solve the aforementioned problem and is aimed to provide a method of manufacturing a semiconductor device in which an upper end corner portion of a mask in trench formation is less likely to be rounded off, thereby improving filling of a trench with an insulating film.

A method of manufacturing a semiconductor device in accordance with the present invention includes the following steps. A silicon oxide film, a silicon nitride film, and an antireflection coating made of a material containing oxygen atoms are successively formed on a semiconductor substrate. The silicon oxide film, the silicon nitride film, and the antireflection coating are patterned. A reduction treatment for reducing an amount of oxygen atoms is performed on the antireflection coating. The antireflection coating after the reduction treatment, the silicon nitride film, and the silicon oxide film are used as a mask to etch the semiconductor substrate, thereby forming a trench in a main surface of the semiconductor substrate. The trench is filled with an insulating film.

In accordance with the present invention, the etching rate in the flat portion of the antireflection coating is increased, for example, by changing the film property of the antireflection coating, so that the upper end corner portion of the antireflection coating is less likely to be rounded off in etching for forming a trench. Therefore, the upper end corner portion of the silicon nitride film is also less likely to be rounded off in the etching, resulting in a desired shape of the trench. As a result, the filling of the trench with the insulating film is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
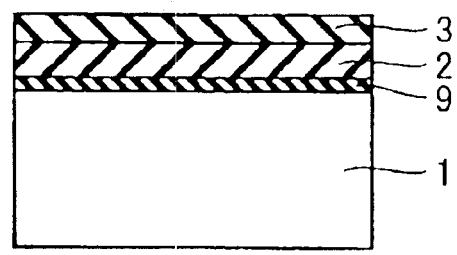
FIGS. 1 to 6 are cross sectional views showing first to sixth steps of a manufacturing process of a semiconductor device in accordance with a first embodiment of the present invention.

In the following, the embodiments of the present invention will be described with reference to FIGS. 1 to 10.

(First Embodiment)

Referring to FIGS. 1 to 6, a first embodiment of the present invention will be described. In the first embodiment, a semiconductor device is manufactured through the following steps. A silicon oxide film, a silicon nitride film, and an antireflection coating made of a material including oxygen atoms are successively formed as a mask film on a semiconductor substrate. The silicon oxide film, the silicon nitride film, and the antireflection coating are patterned into a prescribed shape. A reduction treatment for reducing an amount of oxygen atoms is performed on the antireflection coating. The antireflection coating after the reduction treatment, the silicon nitride film, and the silicon oxide film are used as a mask to etch the semiconductor substrate to form a trench for element isolation in a main surface of the semiconductor substrate. The trench is filled with an insulating film.

The reduction treatment described above is performed by heat treatment on the antireflection coating in an atmosphere in which a gas containing hydrogen atoms is introduced.

The reduction treatment for the antireflection coating as described above can change the film property of the antireflection coating to increase an etching rate (a reactive ion etching rate) of a flat portion of the upper surface of the antireflection coating.

In etching, an etching rate of a flat portion of an upper surface of an etched film has greater dependency on the film property of the etched film, while an etching rate (a sputtering etching rate) of a facet portion (an inclined portion) of the etched film has less dependency on the film property of the etched film. Therefore, only the etching rate of the flat portion of the antireflection coating can substantially be increased by changing the film property of the antireflection coating that is the etched film, as described above.

Since the etching rate of the flat portion of the upper surface of the antireflection coating can be increased in this manner, the upper end corner portion of the antireflection coating is less likely to be rounded off. While the antireflection coating disappears in trench etching, the upper end corner portion of the antireflection coating is less rounded so that the etching amount of the upper end corner portion of the silicon nitride film under the antireflection coating can be reduced. The upper end corner portion of the silicon nitride film is also less likely to be rounded, accordingly.

In trench etching, an amount of etching gas that collides with the upper end corner portion of the silicon nitride film toward the trench sidewall can be reduced, thereby preventing the trench sidewall from being excessively etched and recessed locally. More specifically, an expanded shape in the central portion or in the vicinity of the bottom portion of the trench in the height direction can be prevented, resulting in a trench shape suitable to be filled with an insulating film. When such a trench is filled with an insulating film, the trench may no longer be filled poorly with the insulating film.

A method of manufacturing a semiconductor device in accordance with the first embodiment will now be described in more detail.

First, as shown in FIG. 1, on a main surface of a silicon substrate 1 as an exemplary semiconductor substrate, a silicon oxide film (thermal oxide film) 9 is deposited by a thermal oxidation process, a silicon nitride film ($Si_3N_4$ film) 2 is deposited by CVD (Chemical Vapor Deposition), and a silicon oxynitride film (P-SiON film) 3 is deposited by plasma CVD. This silicon oxynitride film 3 functions as an antireflection coating.

Figure 2:
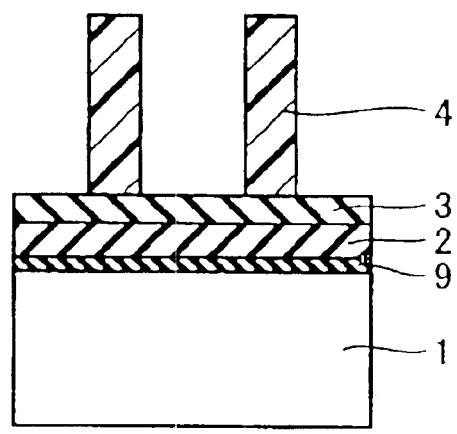
Figure 3:
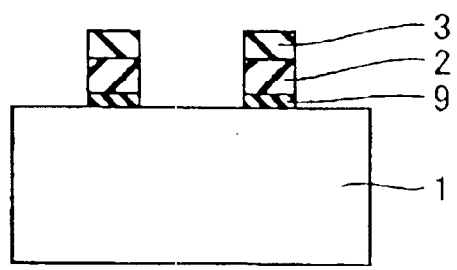

Next, as shown in FIG. 2, a photoresist mask 4 is formed on a region other than a region serving as an element-isolation region by photolithography. Using photoresist mask 4 as a mask, dry-etching is performed to remove silicon oxide film 9, silicon nitride film 2 and silicon oxynitride film 3 on the element-isolation region. Thereafter, as shown in FIG. 3, photoresist mask 4 is stripped off.

Figure 4:
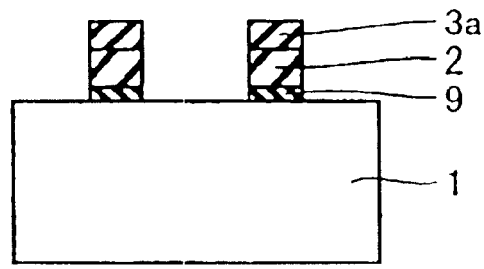

Then, annealing at a temperature of about 350° C.–1100° C. in $H_2$ atmosphere or annealing at a temperature of about 350° C.–1100° C. in $NH_3$ atmosphere is performed on silicon oxynitride film 3. A reduction treatment to reduce the amount of oxygen atoms in silicon oxynitride film 3 can thus be performed to change the film property of silicon oxynitride film 3. As a result, a modified silicon oxynitride film 3a (simply referred to as "silicon oxynitride film 3a" hereinafter) results as shown in FIG. 4. When the oxygen component is mostly removed from the silicon oxynitride film, silicon oxynitride film 3a is a film that contains nitrogen in silicon to some extent.

Figure 5:
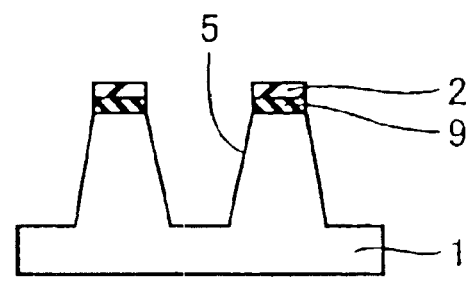

Then, silicon oxynitride film 3a modified through the reduction treatment, silicon nitride film 2 and silicon oxide film 9 are used as a mask to etch silicon substrate 1. A trench 5 is thereby formed as shown in FIG. 5.

The etching rate of the flat portion of the upper surface of silicon oxynitride film 3a is increased by changing the film property through the reduction treatment as described above, while the etching rate of the facet portion of silicon oxynitride film 3a is not so changed. Therefore, in the trench etching described above, the etching rate of the flat portion of the upper surface of silicon oxynitride film 3a can relatively be increased. As a result, silicon oxynitride film 3a can be removed with less rounded upper end corner portion of silicon oxynitride film 3a, and the upper end corner portion of silicon nitride film 2 is less likely to be rounded off.

Here, referring to FIGS. 7 and 8, exemplary shapes of silicon nitride film 2 after removing silicon oxynitride film 3 with the reduction treatment and without the reduction treatment will be described.

Figure 7:
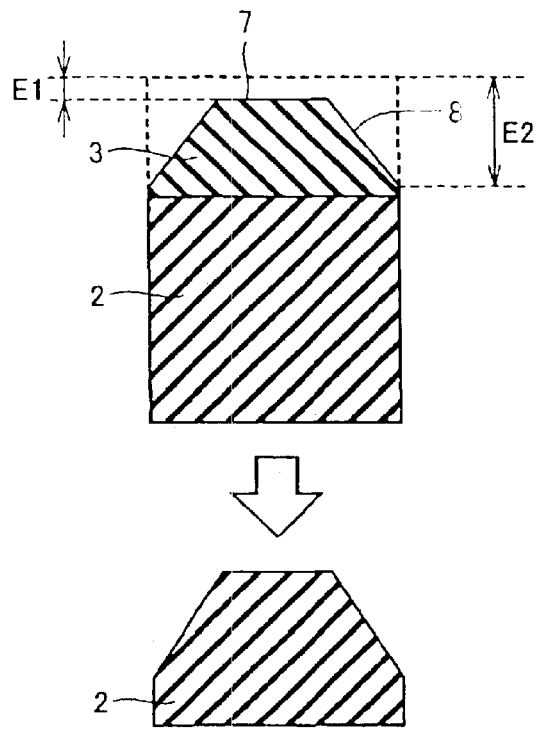
FIG. 7 is a cross sectional view showing an exemplary shape of a silicon oxynitride film and a silicon nitride film in trench etching without a reduction treatment.

FIG. 7 shows exemplary shapes of silicon oxynitride film 3 and silicon nitride film 2 without reduction treatment. FIG. 8 shows exemplary shapes of silicon oxynitride film 3a and silicon nitride film 2 with reduction treatment. Although FIGS. 7 and 8 show that an even inclined shape is formed at the upper end corner portion of silicon oxynitride film 3, 3a and silicon nitride film 2 for convenience of illustration, the upper end corner portion presumably assumes a rounded shape in an actual device.

As shown in FIG. 7, without reduction treatment, the etching rate of facet portion 8 is greater than the etching rate of flat portion 7 of the upper surface of silicon oxynitride film 3, so that an etching amount E2 of facet portion 8 is much larger than an etching amount E1 of flat portion 7, and an etching amount of the upper end corner portion of silicon nitride film 2 is increased. This results in a beveled state of the upper end corner portion of silicon nitride film 2 as shown in the lower view of FIG. 7. As a result, the upper end corner portion of silicon nitride film 2 is rounded (the curvature of the upper end corner portion is increased).

Figure 8:
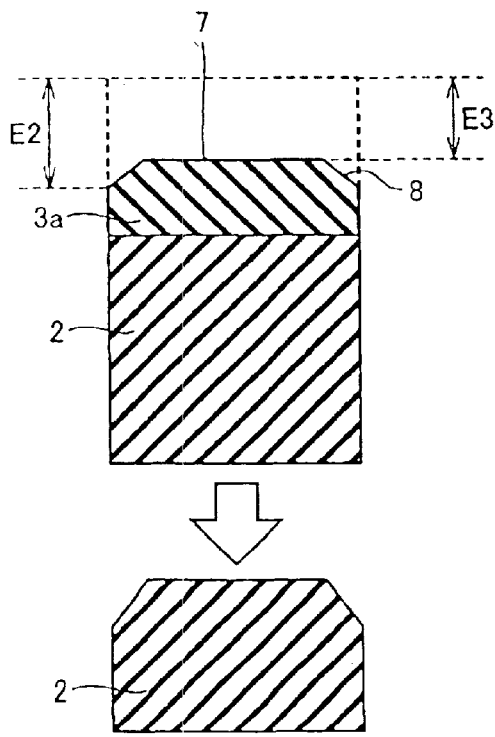
FIG. 8 is a cross sectional view showing an exemplary shape of a silicon oxynitride film and a silicon nitride film in trench etching with a reduction treatment.

By contrary, with reduction treatment as in the example of FIG. 8, while an etching amount E3 of flat portion 7 of silicon oxynitride film 3a is increased, etching amount E2 of facet portion 8 is hardly changed. Therefore, as compared with FIG. 7, the etching amount of the upper end corner portion of silicon nitride film 2 can be reduced, and the upper end corner portion of silicon nitride film 2 is less rounded as shown in the lower view of FIG. 8 (the curvature of the upper end corner portion is reduced).

By using silicon oxynitride film 3a subjected to reduction treatment as described above as a part of a mask in trench etching, the upper end corner portion of silicon nitride film 2 is less likely to be rounded, and an amount of etching gas that collides with the upper end corner portion of silicon nitride film 2 toward trench 5 sidewall can be reduced, accordingly. Therefore, the sidewall of trench 5 may no longer be etched excessively.

Figure 6:
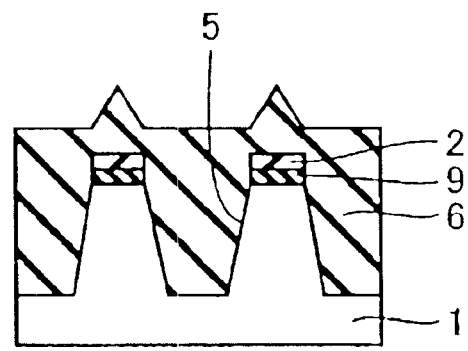

After oxidation of the inner wall of trench 5, trench 5 is filled with a silicon oxide film 6, for example, by HDP (High Density Plasma)-CVD, as shown in FIG. 6. At this time, the shape of trench 5 is suitable to be filled with silicon oxide film 6 as shown in FIG. 5, thereby preventing the trench from being poorly filled with silicon oxide film 6.

Thereafter, a trench element-isolation structure is formed through well-known processes and a variety of elements (not shown) such as MOS (Metal Oxide Semiconductor) transistors are formed in the element-forming region.

(Second Embodiment)

Figure 9:
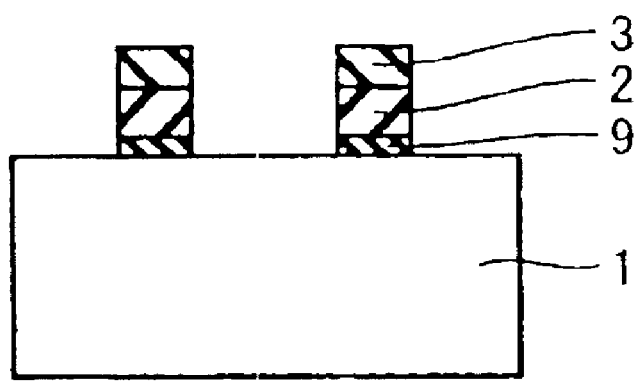
FIGS. 9 and 10 are cross sectional views showing third and fourth steps of a manufacturing process of a semiconductor device in accordance with a second embodiment of the present invention.

A second embodiment of the present invention will now be described with reference to FIGS. 9 and 10. In the second embodiment, an antireflection coating, a silicon nitride film and a silicon oxide film as patterned using a similar technique as in the first embodiment are used as a mask to etch a semiconductor substrate using an etching gas with a higher etching rate in the flat portion of the upper surface of the antireflection coating than the etching rate of the facet portion, thereby forming a trench for element isolation in the main surface of the semiconductor substrate. The other steps are basically similar to those in the first embodiment.

The semiconductor substrate is etched using etching gas with a higher etching rate in the flat portion of the upper surface of the antireflection coating than the etching rate in the facet portion as described above, so that the antireflection coating can disappear with the upper end corner portion of the antireflection coating being less rounded. Therefore, the upper end corner portion of the silicon nitride film as a mask film is less likely to be rounded off, and the similar effect as in the first embodiment can be expected.

In the present embodiment, a typical antireflection coating also includes a silicon oxynitride film that is deposited by plasma CVD. The etching gas includes a fluorocarbon based gas. Here, the fluorocarbon based gas is a gas containing C, F, such as $CF_4$ or $CHF_3$.

A method of manufacturing a semiconductor device in accordance with the second embodiment will now be described in more detail.

Through the step similar to that in the first embodiment, silicon oxide film 9, silicon nitride film 2 and silicon oxynitride film 3 are formed on the main surface of silicon substrate 1, and these films are patterned into a prescribed shape by photolithography (see FIGS. 1 and 2). As shown in FIG. 9, a stacked structure of silicon oxide film 9, silicon nitride film 2 and silicon oxynitride film 3 is left on the element-forming region on the main surface of silicon substrate 1.

Figure 10:
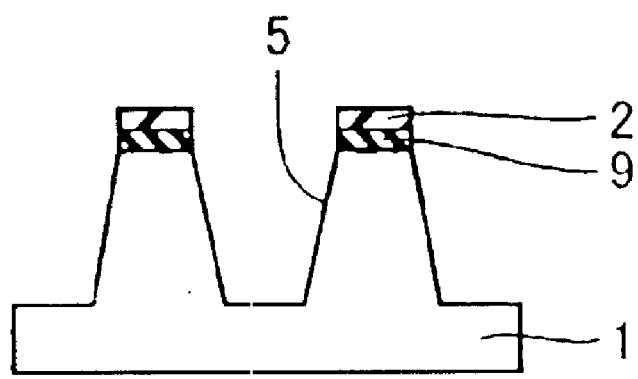

Silicon oxide film 9, silicon nitride film 2 and silicon oxynitride film 3 are then used as a mask to etch silicon substrate 1, thereby forming trench 5 in silicon substrate 1 as shown in FIG. 10. Here, a fluorocarbon based gas ($CF_4$ or the like) having a high reactivity is used as etching gas. Therefore, the etching rate in the flat portion of the upper surface of silicon oxynitride film 3 can be increased, and silicon oxynitride film 3 can disappear with the upper end corner portion of silicon oxynitride film 3 being less rounded. Thereafter, through the similar step as in the first embodiment, a semiconductor device results.

(Third Embodiment)

A third embodiment will now be described. It is noted that the figures showing the manufacturing steps in the third embodiment are similar to those in the second embodiment and thus are not shown here.

In the third embodiment, an antireflection coating made of a material containing oxygen atoms, a silicon nitride film, and a silicon oxide film are patterned and the patterned stacked films are used as a mask to etch a semiconductor substrate with a gas having a reduction function being added to an etching gas, thereby forming a trench for element isolation in the main surface of the semiconductor substrate. The other steps are basically similar to those in the first embodiment.

The semiconductor substrate is etched using a gas having a reduction function as described above, so that it is possible to form a trench while reducing the antireflection coating made of a material containing oxygen atoms. Therefore, the antireflection coating can disappear with the upper end corner portion of the antireflection coating being less rounded. The upper end corner portion of the silicon nitride film is therefore less likely to be rounded off, and the similar effect as in the first embodiment can be expected.

In the present embodiment, a typical antireflection coating also includes a silicon oxynitride film that is deposited by plasma CVD. A gas having a reduction function includes a gas having hydrogen atoms, such as $H_2$ gas or $NH_3$ gas.

A method of manufacturing a semiconductor device in accordance with the third embodiment will now be described in more detail.

Through the similar step as in the first embodiment, silicon oxide film 9, silicon nitride film 2, and silicon oxynitride film 3 are formed on the main surface of silicon substrate 1, and these films are patterned into a prescribed shape by photolithography (see FIGS. 1 and 2). Similar to the example in FIG. 9, a stacked structure of silicon oxide film 9, silicon nitride film 2 and silicon oxynitride film 3 is left on the element-forming region on the main surface of silicon substrate 1.

Then, silicon oxide film 9, silicon nitride film 2, and silicon oxynitride film 3 are used as a mask to etch silicon substrate 1, thereby forming trench 5, as in the example in FIG. 10. Here, $H_2$ gas or $NH_3$ gas having a high reduction ability is added to the etching gas. Trench etching can be performed while reducing silicon oxynitride film 3, and silicon oxynitride film 3 can disappear with the upper end corner portion of silicon oxynitride film 3 being less rounded, as in the first and second embodiments. Thereafter, through the step similar to that in the first embodiment, a semiconductor device results.

While the embodiments of the present invention have been described above, it is initially intended that the features of the embodiments are combined as appropriate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a silicon oxide film, a silicon nitride film, and an antireflection coating made of a material containing oxygen atoms, successively on a semiconductor substrate;

patterning said silicon oxide film, said silicon nitride film and said antireflection coating;

performing a reduction treatment for reducing an amount of said oxygen atoms in said antireflection coating;

using said antireflection coating after said reduction treatment, said silicon nitride film, and said silicon oxide film as a mask to etch said semiconductor substrate, thereby forming a trench in a main surface of said semiconductor substrate; and filling said trench with an insulating film.

2. The method of manufacturing a semiconductor device according to claim 1 wherein said reduction treatment is performed by performing a thermal treatment on said antireflection coating in an atmosphere into which a gas containing hydrogen atoms is introduced.

3. A method of manufacturing a semiconductor device, comprising the steps of:

forming a silicon oxide film, a silicon nitride film, and an antireflection coating made of a material containing oxygen atoms, successively on a semiconductor substrate;

patterning said silicon oxide film, said silicon nitride film, and said antireflection coating;

using said antireflection coating, said silicon nitride film, and said silicon oxide film as patterned as a mask to etch said semiconductor substrate using an etching gas with a higher etching rate in a flat portion of an upper surface of said antireflection coating than an etching rate in a facet portion, thereby forming a trench in a main surface of said semiconductor substrate; and filling said trench with an insulating film.

4. The method of manufacturing a semiconductor device according to claim 3 wherein said etching gas includes a fluorocarbon-based gas.

5. A method of manufacturing a semiconductor device, comprising the steps of:

forming a silicon oxide film, a silicon nitride film, and an antireflection coating made of a material containing oxygen atoms, successively on a semiconductor substrate;

patterning said silicon oxide film, said silicon nitride film, and said antireflection coating;

using said antireflection coating, said silicon nitride film, and said silicon oxide film as patterned as a mask to etch said semiconductor substrate using a gas having a reduction function, thereby forming a trench in a main surface of said semiconductor substrate; and filling said trench with an insulating film.

6. The method of manufacturing a semiconductor device according to claim 5 wherein said gas having a reduction function includes a gas containing hydrogen atoms, and said trench is formed by etching said semiconductor substrate while deoxidizing said antireflection coating.

* * * * *